(12) United States Patent
Landru et al.

(10) Patent No.: US 9,718,261 B2
(45) Date of Patent: Aug. 1, 2017

(54) ASSEMBLY PROCESS OF TWO SUBSTRATES

(71) Applicants: Soitec, Bernin (FR); Commissariat A L'Energie Atomique et aux Energies Alternatives, Paris (FR)

(72) Inventors: Didier Landru, Champ Pres Froges (FR); Capucine Delage, La Croix de la Rochette (FR); Franck Fournel, Villard-Bonnot (FR); Elodie Beche, Grenoble (FR)

(73) Assignees: SOITEC, Bernin (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/947,254

(22) Filed: Nov. 20, 2015

(65) Prior Publication Data
US 2016/0152017 A1 Jun. 2, 2016

(30) Foreign Application Priority Data
Nov. 27, 2014 (FR) .................................... 14 61544

(51) Int. Cl.
*H01L 21/30* (2006.01)
*B32B 37/00* (2006.01)
(Continued)

(52) U.S. Cl.
CPC ...... *B32B 37/0007* (2013.01); *B32B 38/0036* (2013.01); *H01L 21/2007* (2013.01);
(Continued)

(58) Field of Classification Search
CPC ..................... H01L 21/76254; H01L 21/2007
See application file for complete search history.

(56) References Cited

U.S. PATENT DOCUMENTS

| 2004/0132304 A1 | 7/2004 | Farrens et al. |
| 2013/0139946 A1 | 6/2013 | Gaudin et al. |

(Continued)

FOREIGN PATENT DOCUMENTS

EP 2579303 A1 4/2013

OTHER PUBLICATIONS

Masteika et al., "A review of hydrophilic silicon wafer bonding", ECS Journal of Solid State Science and Technology, Vo. 3, No. 4, (2014), pp. Q42-Q54.
(Continued)

*Primary Examiner* — Bradley K Smith
(74) *Attorney, Agent, or Firm* — TraskBritt

(57) ABSTRACT

A method for assembling two substrates by molecular adhesion comprises: a first step (a) of putting first and second substrates in close contact in order to form an assembly having an assembly interface; a second step (b) of reinforcing the degree of adhesion of the assembly beyond a threshold adhesion value at which water is no longer able to diffuse along the assembly interface. The method also comprises a step (c) of anhydrous treatment of the first and second substrates in a treatment atmosphere having a dew point below −10° C., and control of the dew point of a working atmosphere to which the first and second substrates are exposed from the anhydrous treatment step (c) until the end of the second step (b) so as to limit or prevent the appearance of bonding defects at the assembly interface.

20 Claims, 5 Drawing Sheets a) c)

b)

(51) Int. Cl.
  *H01L 21/20* (2006.01)
  *B32B 38/00* (2006.01)
  *H01L 21/324* (2006.01)
  *H01L 21/762* (2006.01)

(52) U.S. Cl.
  CPC ...... *H01L 21/324* (2013.01); *H01L 21/76254* (2013.01); *B32B 2038/0048* (2013.01); *B32B 2250/02* (2013.01); *B32B 2307/728* (2013.01); *B32B 2309/60* (2013.01); *B32B 2313/00* (2013.01); *B32B 2457/14* (2013.01)

(56) References Cited

U.S. PATENT DOCUMENTS

| | | | |
|---|---|---|---|
| 2013/0320404 A1 | 12/2013 | Usenko | |
| 2014/0017877 A1* | 1/2014 | Plach | H01L 21/2007 438/455 |
| 2014/0174649 A1* | 6/2014 | Agraffeil | B32B 38/0008 156/272.6 |
| 2014/0295642 A1* | 10/2014 | Fournel | H01L 21/187 438/458 |
| 2015/0079759 A1 | 3/2015 | Rieutord | |

OTHER PUBLICATIONS

Ventosa et al., "Hydrophilic Low Temperature Direct Wafer Bonding", Journal of Applied Physics, vol. 104, (2008), pp. 123524-1-123524-6.
Preliminary Search Report for French Application No. FR 1461544, dated Sep. 30, 2015, 2 pages.
Haisma et al., Diversity and Feasibility of Direct Bonding: A Survey of a Dedicated Optical Technology, Applied Optics, vol. 33, No. 7, Mar. 1, 1994, 16 pages.

* cited by examiner

ASSEMBLY PROCESS OF TWO SUBSTRATES

PRIORITY CLAIM

Pursuant to 35 U.S.C. §119(a), this application claims the benefit of the filing date of French Patent Application Serial No. 1461544, filed Nov. 27, 2014, for "Method for Assembling Two Substrates."

TECHNICAL FIELD

The present disclosure relates to a method for assembling two substrates by molecular adhesion.

BACKGROUND

Assembling substrates by molecular adhesion (direct wafer bonding) is a well-known technique that finds applications in the fields of microelectronics, optoelectronics, electromechanical microsystems, for example, for manufacturing silicon-on-insulator substrates, multiple-junction photovoltaic cells and the production of 3D structures.

According to this technique, two substrates are put in close contact so as to bring their surfaces sufficiently close to each other so that they establish between them atomic and/or molecular bonds (hydroxyl or covalent bonds). The presence of water at the assembly interface assists the creation of such bonds. In this way, adhesion forces are created between the two surfaces of the substrates in contact, without using any intermediate adhesion layer, such as a layer of glue or a polymer.

The assembly obtained is then generally subjected to heat treatment at a temperature that may vary between 50° C. and 1200° C., depending on the nature of the substrates and the application envisaged, so as to reinforce the adhesion.

Assembly by molecular adhesion causes, in some cases, the appearance of defects, referred to as "bonding defects," at the bonding interface. It may be a defect of the "bubble" type (bonding voids). The bonding defects may result from the trapping and accumulation of gaseous species between the surfaces of the assembled substrates. These species may correspond to the species adsorbed on the surfaces of the substrates when they are prepared before assembly; they may correspond to residues of chemical reactions, in particular, the chemical reaction of water, which occurs when the substrates are put in close contact or during the bonding reinforcement annealing. A description of the chemical phenomena that occurs during assembly by molecular adhesion is, for example, described in the article "Hydrophilic Low-Temperature Direct Wafer Bonding" by C. Ventosa et al., *Journal of Applied Physics* 104, 123524 (2008) or in the article "A Review of Hydrophilic Silicon Wafer Bonding" by V. Masteika et al., *ECS Journal of Solid State Science and Technology*, 3(4) Q42-Q54 (2014).

The presence of bonding defects at the assembly interface is highly detrimental to the quality of the structures produced. For example, when the assembly step is followed by a step of thinning two substrates in order to form a layer, by grinding or in accordance with SMART CUT® technology, the absence of adhesion between the two surfaces at a bonding defect may lead to local tearing away of the layer at this point. In the case of a 3D integration of components, a bonding defect prevents the components formed on each of the substrates being put in electrical contact, which makes these components non-functional.

One solution envisaged for reducing assembly defects and, in particular, bonding defects, is proposed in U.S. Publication No. 2013/0139946, the contents of which are hereby incorporated herein in their entirety by this reference. This document discloses a method for assembly by molecular adhesion comprising the circulation of a flow of gas over the surfaces of the substrate before they are assembled.

This method discharges the water molecules desorbed on the surfaces by the circulation of the gaseous flow, outside the bonding chamber. And, according to this document, by preventing the saturation of the atmosphere of the chamber with water, the method keeps the quality constant from one assembly to the next.

However, applying this method is tricky and may, for example, depending on the nature of the substrates assembled and after the reinforcement treatment, lead to an insufficient degree of adhesion between the substrates or to the presence of residual bonding defects. It should be noted, in particular, that a gas flow is an important carrier of particulate contamination to which molecular adhesion is highly sensitive, since the particles may give rise to bonding defects.

BRIEF SUMMARY

One aim of the present disclosure is, therefore, to propose a robust method for reducing the number of bonding defects, or even to completely prevent the appearance thereof, when two substrates are assembled by molecular adhesion. Another aim of the present disclosure is to provide a satisfactory degree of adhesion between the assembled substrates.

With a view to achieving at least one of these aims, the subject matter of the present disclosure proposes a method for assembling two substrates by molecular adhesion, comprising:

(a) a first step of putting a first and second substrate in close contact in order to form an assembly having an assembly interface;

(b) a second step of reinforcing the degree of adhesion of the assembly beyond a threshold adhesion value at which water is no longer able to diffuse along the assembly interface.

In accordance with the present disclosure, the method comprises:

(c) a step of anhydrous treatment of the first and second substrates in a treatment atmosphere having a dew point below −10° C.; and (d) control of the dew point of a working atmosphere to which the first and second substrates are exposed from the anhydrous treatment step and until the end of the second step so as to limit or prevent the appearance of bonding defects at the assembly interface.

Thus, by controlling this dew point, the diffusion of water from the atmosphere surrounding the assembly to the assembly interface is prevented, and the appearance of bonding defects is avoided or limited.

According to other advantageous and non-limitative features of the present disclosure, taken alone or in combination:

the control of the dew point of the working atmosphere consists of maintaining its dew point above −10° C. for less than 10 minutes as from step (c) of anhydrous treatment and until the end of the second step (b);

the control of the dew point of the working atmosphere consists of maintaining its dew point below −10° C. as from the anhydrous treatment step (c) and until the end of the second step (b);

the working atmosphere is the atmosphere of the environment in which the method takes place;

the anhydrous treatment step is carried out in a chamber confining the treatment atmosphere;

the second step comprises a thermal annealing of the assembly at a temperature between 50° C. and 1200° C.;

the annealing temperature is above 300° C.;

the annealing is carried out in a neutral annealing atmosphere;

the treatment atmosphere is static;

the treatment atmosphere is at atmospheric pressure;

the step (a) of putting in close contact is carried out at ambient temperature;

the method comprises a prior step of preparing a hydrophilic surface of the first and second substrates;

the method comprises a step of storage of the assembly between the anhydrous treatment step and the second step;

the anhydrous treatment step precedes or is carried out simultaneously with the first step of putting in close contact;

the anhydrous treatment step has a duration of at least 30 seconds before the first and second substrates are put in close contact;

the anhydrous treatment step is carried out subsequently to the first step (a) of putting in close contact;

the first step of putting in close contact is carried out in an atmosphere having a dew point above −10° C.;

the anhydrous treatment step is carried out at a temperature between 20° C. and 150° C.;

the first or second substrate is made from silicon and the temperature of the anhydrous treatment of the step is between 40° C. and 60° C.;

the anhydrous treatment step has a duration of between 1 hour and 100 days.

BRIEF DESCRIPTION OF THE DRAWINGS

The present disclosure will be better understood in the light of the following description of particular non-limitative embodiments of the present disclosure with reference to the accompanying figures, among which.

DETAILED DESCRIPTION

The present disclosure results from observations carried out by the applicants and reported below.

A blank silicon substrate was assembled with another silicon substrate provided with a fine layer of silicon oxide 10 nm thick. A step of putting the substrate in close contact was carried out in a clean-room atmosphere having a standard relative humidity of 50% (corresponding to a dew point of 9° C.); then a step of reinforcement of the adhesion of the two assembled substrates was carried out by means of annealing at 550° C. for 2 hours.

This assembly is particularly sensitive to the appearance of bonding defects, in particular, because of the fineness of the layer of silicon oxide at the assembly interface.

Figure 1:
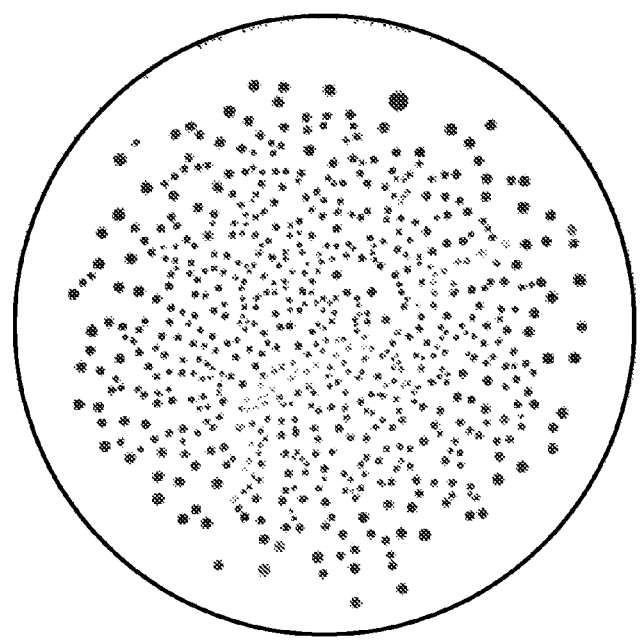
FIG. 1 shows an observation by acoustic microscopy of the assembly interface of two silicon substrates, one being provided with a 10 nm layer of silicon oxide.

At the end of this sequence, the assembly interface is observed by acoustic microscopy. FIG. 1 shows the results of this observation: the black spots distributed over the observation surface correspond to bonding defects, that is to say, regions at the assembly interface where no adhesion has occurred and which may be filled with gas. The contour of the assembly formed by the two substrates can also be seen to appear in this FIG. 1, as well as in the following FIGS. 2a, 2b and 3.

Two other series of experiments were then carried out.

Figure 2A:
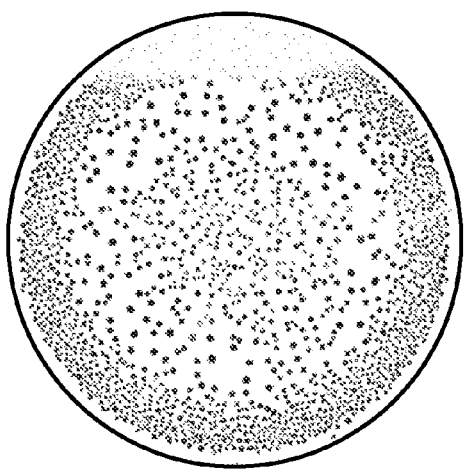
FIGS. 2a and 2b show an observation by acoustic microscopy of the assembly interface of two pairs of substrates that were stored in a moist environment for, respectively, five days and sixty days.
Figure 2B:
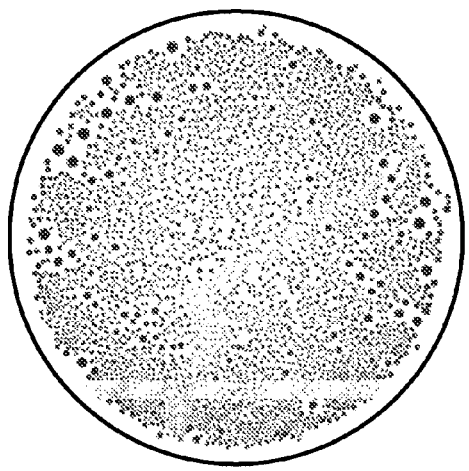

In the first series, two assemblies were formed by assembling substrates identical to those that led to the results in FIG. 1. At the end of the putting in close contact, the two assemblies were maintained in a moist atmosphere (dew point higher than −10° C.) for, respectively, five days and sixty days. At the expiration of these periods, the assemblies were each subjected to the reinforcement annealing at 550° C. for 2 hours, and then the assembly interfaces were observed under acoustic microscopy. These observations are shown in FIGS. 2a and 2b.

By comparison with FIG. 1, it can be seen that the storage in moist atmosphere between the putting in close contact and the reinforcement treatment leads to an appreciable increase in the number of bonding defects and the density thereof. It is also observed that this increase changes with the duration of storage by propagation of the bonding defects at the edge of the substrates toward their center.

In the second series of experiments, an assembly was formed by assembling substrates identical to those that led to the results in FIG. 1. At the end of the putting in close contact, the assembly was maintained in an anhydrous atmosphere having a humidity level below 10 ppm (dew point <−63° C.) for 20 days. At the expiration of this period, the same annealing of 550° C. for 2 hours was applied.

Figure 3:
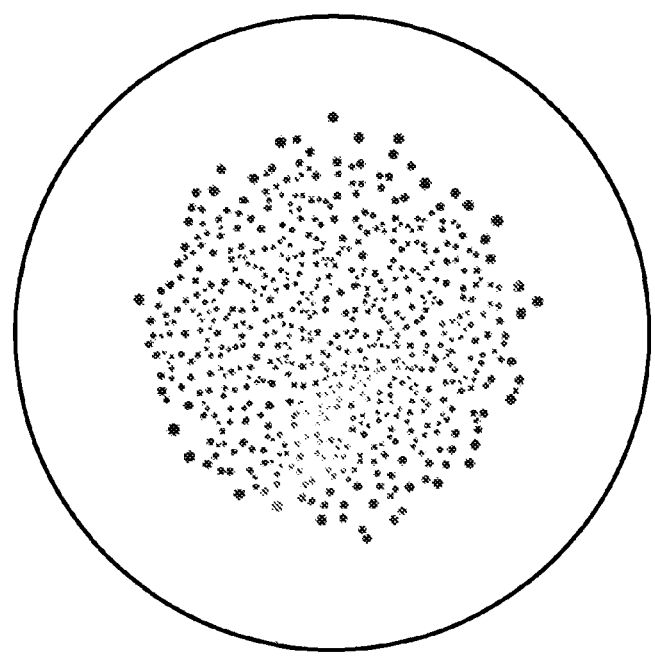
FIG. 3 shows an observation by acoustic microscopy of the assembly interface of a pair of substrates that were stored in an anhydrous environment for twenty days.

FIG. 3 shows the results of the observation under acoustic microscopy of the assembly interface of the assembly after this annealing. In comparison of FIG. 1 and FIG. 3, it can be seen that the storage in anhydrous atmosphere leads to a reduction in the number of bonding defects, in particular, on the peripheral edge of the assembly.

It is, therefore, observed through these experiments, and contrary to established belief, that, after the putting in close contact of the substrates, water is still liable to diffuse between the assembly interface and the atmosphere surrounding the assembly. Thus, a relatively moist environment leads to entry of water from the peripheral edge of the assembly, diffusing toward the center over time. Conversely, a relatively dry atmosphere leads to a discharge of water from the peripheral edges of the assembly.

Supplementary experiments made it possible to analyze this phenomenon more finely. It appears that the diffusion of water out of the assembly interface, which is promoted by a relatively dry atmosphere, is also sensitive to the temperature to which the assembly is exposed.

Figure 4:
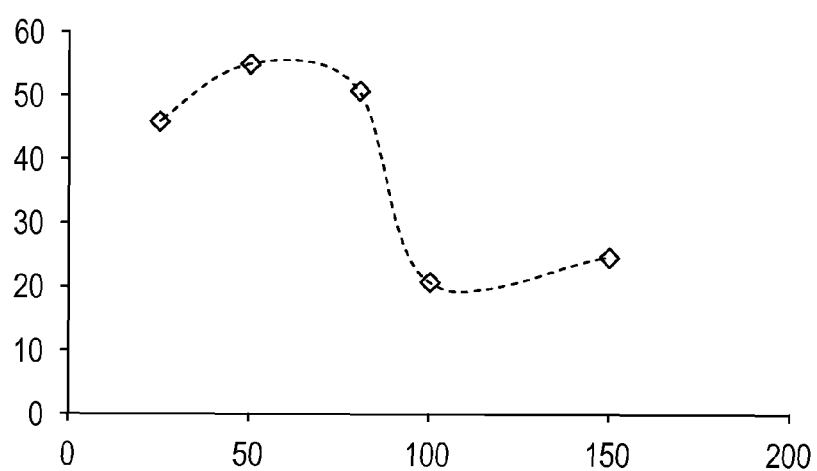
FIG. 4 is a graphical representation presenting the distance of diffusion of water at the assembly interface depending on the storage temperature.

FIG. 4 is a graphical representation of this phenomenon. The Y-axis consists of the dimension (in millimeters) of the annular region totally free from bonding defects after 300 hours of anhydrous storage of an assembly put in close contact, and annealed similarly to the previous experiments. This dimension can be assimilated to the distance of diffusion of water at the assembly interface during storage. The X-axis in this FIG. 4 corresponds to the storage temperature (in degrees Celsius).

It can be seen that this distance has a maximum around a storage temperature of 50° C. The increase in the adhesion energy caused by the exposure of the assembly to the storage temperature opposes the mobility of the water and results in substantially limiting the length of diffusion when the storage temperature increases.

Naturally, the results presented in this FIG. 4 are dependent on the particular experimental conditions that were used (in particular, the surface treatments that preceded the putting in close contact, the thickness of the silicon oxide formed on one of the surfaces of the substrate, etc.) but are, however, well representative of the diffusion phenomena that take place at the assembly interface according to the storage temperature. In particular, the maximum diffusion length may differ from the 50° C. appearing in FIG. 4. In any event, there exists a threshold value of the degree of adhesion of the assembly, beyond which it can be considered that water is no longer liable to diffuse at the assembly interface. Thus, when one of the substrates 1, 2 at least is made from silicon, it can be considered that this threshold value is reached when the annealing temperature is above 300° C.

The present disclosure takes advantage of the phenomena revealed by the experiments that have just been presented in order to elaborate on an assembly method by molecular adhesion that is particularly advantageous and described in the detailed description that follows.

Figure 5:
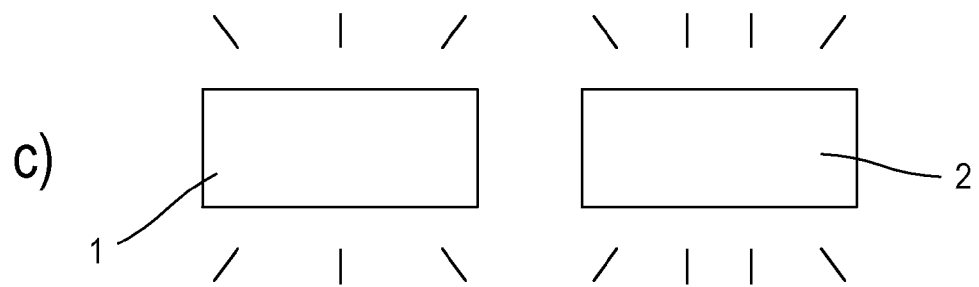
FIG. 5 depicts a first embodiment of the present disclosure.
Figure 5:
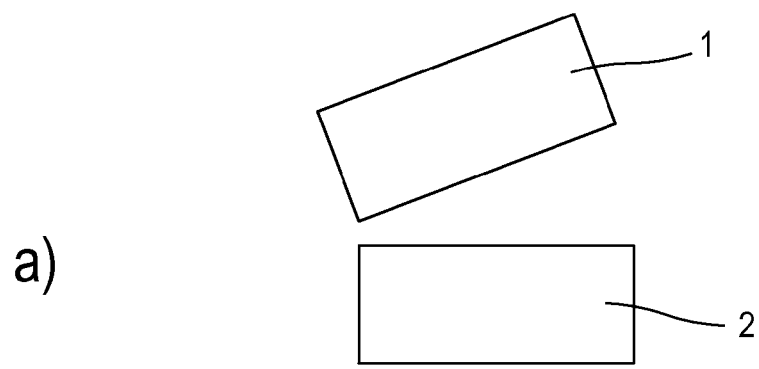
Figure 5:
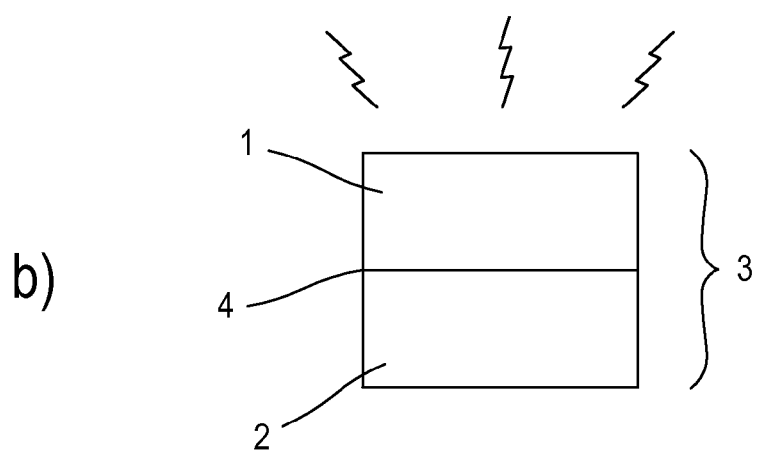
Figure 6:
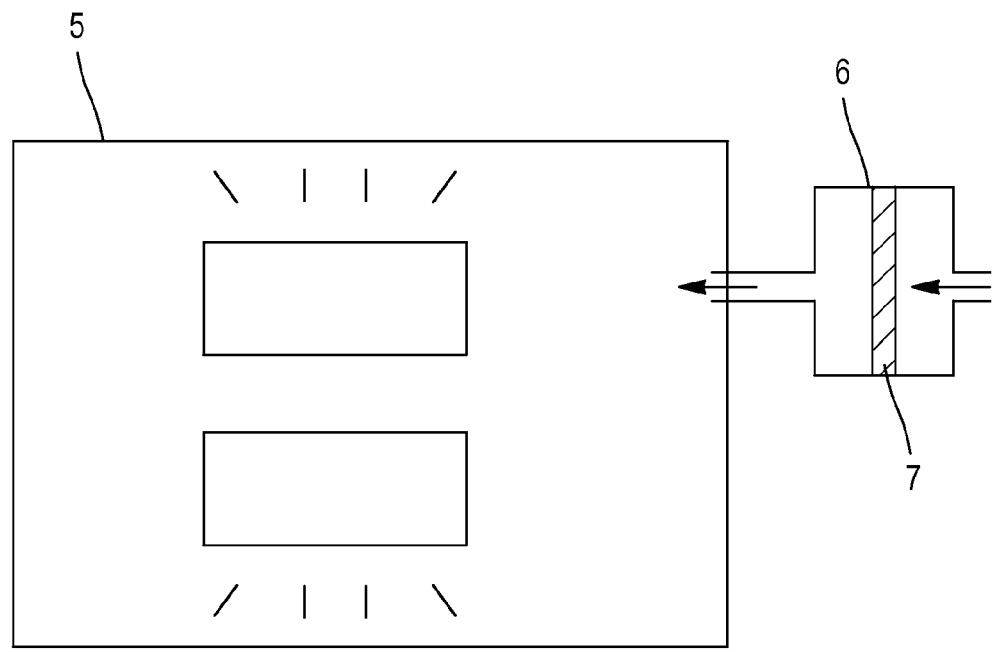
FIG. 6 depicts a variant of the first embodiment of the present disclosure.
Figure 6:
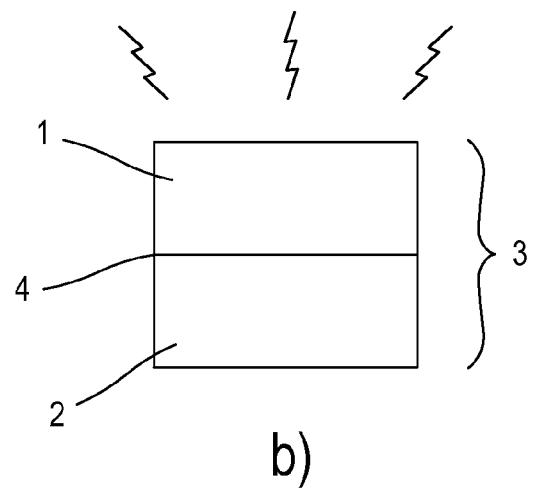
Figure 7:
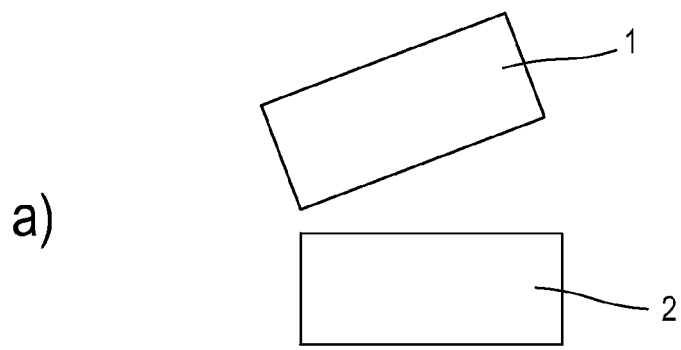
FIG. 7 depicts a second embodiment of the present disclosure.
Figure 7:
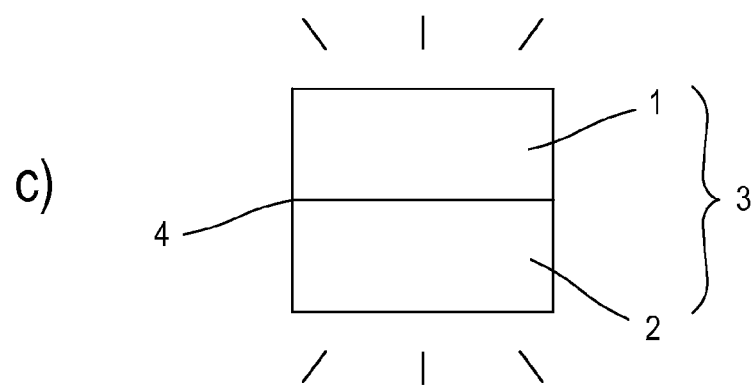
Figure 7:
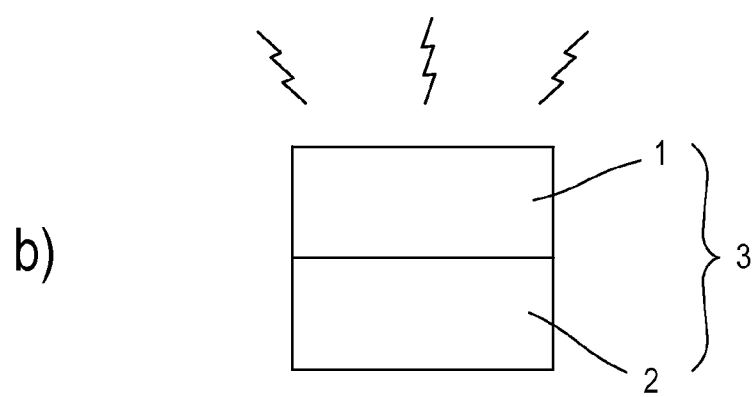

With reference to FIGS. 5 to 7, this assembly method comprises, as is well known per se, a first step (a) of putting a first substrate 1 and a second substrate 2 in close contact in order to form an assembly 3 having an assembly interface 4. Preferentially, for reasons of simplicity of the implementation, step (a) of putting in close contact may be carried out at ambient temperature (that is to say between 10° C. and 30° C.). One or the other of the substrates 1, 2 may be of any nature, but the present disclosure has a particular interest when at least one of the substrates 1, 2 forms or comprises a material reacting chemically with water. As seen previously, this chemical reaction may give rise to bonding defects that develop at the assembly interface of two substrates.

This is the case, in particular, with semiconductor materials such as silicon, germanium, silicon carbide (SiC), indium phosphide (InP) or gallium arsenide (GaAs), or metals such as copper, titanium, tungsten, aluminium or nickel.

This is the case also if a material reacting chemically with water is situated under another material not reacting with water (such as silicon oxide or amorphous alumina) but that may have water pass through it, the latter then being able to react with the underlying material.

Prior to step (a) of putting in close contact, the two substrates 1, 2 may have received hydrophilic surface treatments, such as cleaning or activation by plasma or polishing.

One or other or both of the substrates 1, 2 may have been provided with an intermediate layer, such as a silicon oxide or nitride.

The assembly method also comprises a second step (b) of reinforcing the degree of adhesion of the assembly 3 beyond a threshold adhesion value for which water is no longer able to diffuse to the assembly interface 4.

The second reinforcement step (b) may comprise or correspond to a heat treatment, in particular, annealing, for example, at a temperature between 50° C. and 1200° C., and the duration of which may extend from a few seconds to several hours. The annealing may be carried out in a neutral atmosphere (e.g., an inert atmosphere).

The exact value of the adhesion threshold at which water is no longer able to diffuse, in particular, at the assembly interface 4, may vary according to the nature of the materials assembled, or even according to the degree of humidity of the atmosphere surrounding the assembly 3. However, when at least one of the substrates 1, 2 is made from silicon, it can be considered that this threshold value is reached when the annealing temperature is above 300° C. A person skilled in the art will easily be able to determine this threshold value for other materials, for example, from experiments similar to those disclosed herein.

According to the present disclosure, the assembly method also comprises a step (c) of anhydrous treatment of the first substrate 1 and of the second substrate 2 in a treatment atmosphere having a dew point below −10° C. This step (c) precedes the step (b) of reinforcement of the degree of adhesion.

It will be recalled that the dew point is defined as the lowest temperature to which a gas can be subjected without formation of liquid water occurring by saturation. It is a traditional and reliable measurement of the moisture level of a gas.

The anhydrous treatment of the present disclosure is, therefore, carried out in a particularly dry atmosphere for limiting or reducing the quantity of water at the assembly interface 4. Thus, the dew point of the anhydrous treatment may be chosen below −10° C., or below −50° C. or even below −85° C.

In order to limit the development of bonding defects while making it possible to obtain a satisfactory degree of adhesion, the present disclosure also provides for the dew point of the working atmosphere to which the two substrates 1, 2 are exposed to be controlled as from the anhydrous treatment step (c) and until the end of the second step (b) of reinforcement of the degree of adhesion.

"Control" means that this dew point must be maintained sufficiently low during the time elapsing between the end of step (c) of anhydrous treatment and the second step (b) of reinforcement of the degree of adhesion in order to prevent the water coming from the working atmosphere that would diffuse at the assembly interface 4 to lead to the appearance or development of bonding defects. At the same time, this dew point may be adjusted so that the assembly interface 4 has sufficient water to make it possible to develop a sufficient degree of adhesion between the two substrates 1, 2. The nature of this control will be detailed in more detail in each of the embodiments of the present disclosure described in further detail below.

A first embodiment of the present disclosure is shown in FIG. 5. In this first embodiment, the step (c) of anhydrous treatment precedes or is carried out simultaneously with the first step (a) of putting the first and second substrates 1, 2 in close contact.

Several ways make it possible to achieve this. According to a first way, which may, moreover, be implemented in each of the embodiments of the present disclosure, the working atmosphere is the atmosphere of the environment in which the assembly method takes place (commonly referred to as a "clean room"). This atmosphere may be maintained at a dew point below −10° C. Thus, all the steps and processing operations making up the method and, in particular, step (a) of putting in close contact, take place in a particularly dry atmosphere, maintaining a controlled quantity of water at the surface of the substrates and at the assembly interface.

In the field of microelectronics and of the assembly of substrates, it is usual to maintain a relative humidity of the working environment of between 30% and 50% (corresponding to a dew point of between 3° C. and 9° C.). There do exist, however, fields, such as the field of the manufacture of batteries, where a working atmosphere having a dew point below −10° C. is usual. This way of carrying out the anhydrous treatment of the present disclosure may require relatively complex facilities, but has the advantage of also providing control of the dew point of the working atmosphere from step c) of anhydrous treatment until the end of the second step (b).

In this case, controlling the dew point of the working atmosphere consists of keeping the assembly 3 in the atmosphere of the working room at the dew point of less than −10° C. and throughout this period. Depending on the sequencing of the steps during the method, this period may be between 1 hour and 100 days, or even more.

According to a second way of applying step (c), depicted in FIG. 6, the anhydrous treatment is carried out simultaneously with the first step (a) of putting in close contact. Steps (c) and (a) can, thus, be carried out simultaneously in an enclosure 5 for confining the treatment atmosphere. The confinement enclosure 5 may be a chamber of assembly equipment in which step (a) of putting in close contact takes place.

The enclosure 5 or chamber is then maintained at a dew point below −10° C. by suitable means. It may, for example, be a unit 6 for purifying the gases entering the enclosure 5 or chamber. The gas making up the treatment atmosphere circulates, prior to its entry into the enclosure 5 or chamber, in the purification unit via a molecular sieve 7, for example, made from copper, which fills with water from the atmosphere in order to produce a particularly dry gas, the dew point of which can be controlled.

When the first substrate 1 and the second substrate 2 are introduced into the confinement enclosure 5 or the assembly chamber, the first and second substrates 1, 2 are both exposed to the confined atmosphere having the dew point below −10° C. This exposure then constitutes the anhydrous treatment steps (c) of the present disclosure.

Preferentially, for simplicity of implementation, the confined anhydrous treatment atmosphere may be at atmospheric pressure and the confined treatment atmosphere may be static, that is to say, this atmosphere does not circulate in the form of a flow caused in the chamber. In this way, contaminating the surfaces with particles before assembly thereof is avoided.

Advantageously, the exposure of the surfaces of the substrates 1, 2 to the confined anhydrous treatment atmosphere may have a duration of 30 seconds or more before the first and second substrates 1, 2 are put in close contact. In this way, it may be ensured that the quantity of water present on the surface of the substrates 1, 2 is at a required equilibrium. For the same reason, it is possible to choose to heat the confined treatment atmosphere, for example, to a temperature or temperatures between 20° C. and 150° C. The step of putting in close contact may be carried out in the same confined environment.

At the end of these steps, and whatever the manner of applying the anhydrous treatment step (c) in this further embodiment, the assembly 3 formed by assembling the first substrate 1 and the second substrate 2 is available, having a controlled quantity of water at the assembly interface 4.

As previously depicted in FIGS. 5 and 6, this first step (a) is followed by a second step (b) of reinforcing the degree of adhesion of the assembly 3 beyond the threshold value for which water is no longer liable to diffuse.

In order to keep the quantity of water reduced at the assembly interface 4 to a level limiting the appearance of the development of a bonding defect, the dew point of the working atmosphere to which the assembly 3 is exposed is controlled between these two steps.

As discussed previously, this control may be achieved when the entire atmosphere of the room in which the method takes place is maintained at a dew point, for example, below −10° C.

In an alternative and, in particular, when the anhydrous treatment step (c) is carried out inside a confinement enclosure, the assembly method may be conducted so that the assembly 3 is not exposed to an atmosphere having a dew point above −10° C. for more than 10 minutes. In other words, controlling the dew point of the working atmosphere consists, in this case, of maintaining the dew point at a temperature above −10° C. for less than 10 minutes, from the anhydrous treatment step (c) until the end of the second step (b).

Experience has shown that by thus limiting the exposure to a dew point of above −10° C. for this maximum period of 10 minutes, it was possible to limit the diffusion of water at the assembly interface 4 and to preserve the quality of this bonding, in particular, vis-à-vis bonding defects.

This may be implemented by sequencing the method so that the start of the second step (b) is carried out less than 10 minutes after the extraction of the assembly 3 from the confinement enclosure 5.

According to a preferred embodiment, step (b) corresponds to an annealing, and the gas forming the annealing atmosphere has a dew point of below −10° C. It is thus ensured that, during the first moments of this reinforcement annealing, while the degree of adhesion has not yet reached the threshold value, water present in the annealing gas does not diffuse into and along the assembly interface.

When the gas circulating in the annealing furnace is not dry (that is to say, having a dew point above −10° C.), it may be ensured that the duration of exposure between the end of the anhydrous treatment step (c) and the start of the second step, added to the annealing time necessary for achieving the threshold adhesion value, is 10 minutes or less.

In the case where it is not possible to systematically concatenate the anhydrous treatment step (c) and the second step (b) in less than 10 minutes, the present disclosure makes provision for storing the assembly 3 in a zone, such as a stove, furnace, or an enclosed chamber, having a controlled atmosphere with a dew point below −10° C. This storage may have any duration, for example, from 1 hour to 100 days or more, without risking water being introduced in excess at the assembly interface 4 and, therefore, affecting the bonding quality.

This storage may also be done in an atmosphere having a dew point much lower than −10° C., such as −30° C. or −80° C. and, optionally, in a temperature from 20° C. to 150° C., for example. These arrangements make it possible to further improve the quality of the bonding.

In a second embodiment of the present disclosure depicted in FIG. 7, the anhydrous treatment step (c) is carried out subsequently to the first step (a) of putting the two substrates 1, 2 in close contact. The present disclosure, therefore, takes advantage of the observation according to which the water is liable to diffuse from the assembly interface 4 of the assembly 3 toward its external environment in order to control the quantity of water at the assembly interface 4.

In this case, the first step (a) of putting in close contact can, therefore, be carried out in an atmosphere having a dew point above −10° C. It is, therefore, not necessary to perform step (a) in a confined environment such as a chamber and/or to provide the assembly equipment with a purification unit. This is, therefore, particularly advantageous.

Moreover, a major part of the assembly method can take place in any atmosphere, provided that the anhydrous treatment step (c) is provided before the second step (b) and provided that the working atmosphere is controlled between the anhydrous treatment step (c) and the end of the second step (b).

Thus, it is possible to make provision for storing the assembly 3 for any period, in any atmosphere, between the first step (a) of putting in close contact and the anhydrous treatment step (c).

In this second embodiment, the assembly 3 formed by assembling the first substrate 1 and the second substrate 2 obtained at the end of the first step (a) has an uncontrolled quantity of water at its assembly interface 4.

In order to improve the quality of assembly, in particular, vis-à-vis bonding defects, the assembly 3 undergoes anhydrous treatment, during a step (c), having a dew point below −10° C., for example, −30° C. or −80° C.

Preferentially, this treatment is carried out in a furnace for heating the assembly 3 to a temperature or temperatures between 20° C. and 150° C. so as to assist the diffusion of water and, in particular, from the assembly interface 4 toward its external environment.

As in the previous embodiment, and so as to provide a dew point below −10° C., the furnace may be associated with a unit for purifying its atmosphere, making it possible to circulate a dry gas having the dew point below −10° C. in its enclosure.

The duration of this anhydrous treatment may be adapted according to circumstances. If it is wished, for example, for all the excess water at the assembly interface 4 (over the entire extent of the surfaces in contact) to diffuse, this period is then adjusted to the size of the substrates 1, 2.

Thus, for circular silicon substrates 1, 2, the duration of this anhydrous treatment when the assembly 3 is heated to 50° C. and subjected to a dew point of −50° C. during this treatment is given by the following table:

| Diameter of the substrates 1, 2 in mm | Duration of treatment in days |
| --- | --- |
| 50 | 2.6 |
| 100 | 11 |
| 150 | 24 |
| 200 | 43 |
| 300 | 97 |

It should be noted that the experimental values presented above correspond to mean values and can be adjusted, in particular, according to the quantity of water present at the assembly interface 4 before the anhydrous treatment.

In other circumstances, it may not be necessary to seek to diffuse the water of the entire extent of the assembly interface 4 and diffusion over a small peripheral distance may be sufficient. It may be possible in this case to reduce the duration of the anhydrous treatment given in the above table.

The second step (b) of reinforcement of the degree of adhesion of the assembly method is performed following the anhydrous treatment step (c). According to a preferred embodiment, the gas forming the annealing atmosphere has a dew point below −10° C. It is thus ensured that, during the first moments of this reinforcement annealing, while the adhesion energy has not yet reached the threshold value, water present in the annealing gas does not diffuse in excess into and along the assembly interface 4.

As in the first embodiment, the working atmosphere to which the assembly 3 is exposed between the anhydrous treatment step (c) and the second step (b) may be controlled. The same means described in the context of the first embodiment also apply to the second embodiment and will, therefore, not be repeated.

Example 1

Two substrates made from silicon <001> with a diameter of 200 mm and a resistivity p of between 1 and 50 ohms/cm are cleaned with a solution of ozonized water having 40 mg/l of ozone, with a solution of APM (ammonium peroxide mixture) with a concentration of ammonia, hydrogen peroxide and deionized water of, respectively, 0.25/1/5. Next, the two wafers are dried and placed in an assembly chamber at ambient temperature, and having a nitrogen atmosphere at a dew point below −85° C. After waiting for 1 minute, the two surfaces are assembled and the assembly is removed from the chamber. Less than 10 minutes later, the assembly is placed in a tube furnace under nitrogen, with the nitrogen having less than 100 ppb of water (−90° C. dew point). Whatever the temperature of the annealing that follows at a temperature or temperatures between 50° C. and 1200° C., the bonding does not show the appearance of any bonding defect. Moreover, the degree of adhesion between the two substrates is sufficient to proceed with the mechanical thinning of one of the two substrates.

Example 2

Two substrates identical to those of Example 1 are also prepared identically to this example 2. After drying, the two substrates are assembled temporarily, at ambient temperature. Next, the assembly consisting of these two assembled substrates is placed in a clean room containing air that has a dew point below −40° C. or in an enclosure with a nitrogen atmosphere with a dew point below −85° C. The two substrates are then detached and their surfaces exposed to this anhydrous atmosphere. After waiting for 1 minute, the two substrates are assembled at ambient temperature and brought out of the clean room or enclosure. Less than 10 minutes later, the assembly is placed in a tube furnace under nitrogen, with the nitrogen having less than 100 ppb of water (−90° C. dew point). Before the temperature is raised, this atmosphere is maintained for 10 minutes. Whatever the annealing temperature that follows at a temperature or temperatures between 50° C. and 1200° C., the bonding does not show the appearance of any bonding defect. Moreover, the degree of adhesion between the two substrates is sufficient to proceed with the mechanical thinning of one of the two substrates.

Example 3

In a clean room containing air that has a dew point below −40° C., two substrates made from silicon <001> with a diameter of 200 mm and a resistivity of between 1 and 500 ohms/cm are cleaned identically to Example 1. After drying, the two substrates are assembled at ambient temperature. Without leaving this dry clean room, the assembly is placed in a tube furnace under nitrogen, with the nitrogen having less than 100 ppb of water (−90° C. dew point). Before the temperature is raised, this atmosphere is maintained for 10 minutes. Whatever the annealing temperature that follows at a temperature or temperatures between 20° C. and 1200° C., the bonding does not show the appearance of any bonding defect. Moreover, the degree of adhesion between the two substrates is sufficient to proceed with the mechanical thinning of one of the two substrates.

Example 4

Two substrates identical to those of Example 1 are also prepared identically to this example. After drying, the two substrates are assembled. Next, in a clean room containing air that has a dew point below −40° C., the substrates are detached and exposed for 1 minute to the air of this clean room. The substrates are then re-bonded at ambient temperature. Without leaving this dry clean room, the assembly formed by the two assembled substrates is placed in a tube furnace under nitrogen with the nitrogen having less than 100 ppb of water (−90° C. dew point). Before the temperature is raised, this atmosphere is maintained for 10 minutes. Whatever the annealing temperature that follows at a temperature or temperatures between 20° C. and 1200° C., the bonding does not show the appearance of any bonding defect. Moreover, the degree of adhesion between the two substrates is sufficient to proceed with the mechanical thinning of one of the two substrates.

Example 5

Two substrates made from silicon <001> with a diameter of 200 mm, similar and prepared in an identical fashion to those in the previous examples, are assembled in bonding equipment not having a confined chamber. They are assembled in an atmosphere having a standard dew point of 9° C. (that is to say, a relative humidity of 50%) and at ambient temperature. The assembled substrates are then placed in a furnace in which a neutral nitrogen gas circulates at a temperature of 50° C., the neutral gas having a dew point of −80° C., for 43 days. The bonded structure is then directly placed in a tube furnace under nitrogen having less than 100 ppb of water (dew point −90° C.). Whatever the annealing temperature that follows at a temperature or temperatures between 300° C. and 1200° C., the bonding observed after this heat treatment does not show the appearance of any bonding defect. Moreover, the degree of adhesion between the two substrates is sufficient to proceed with the mechanical thinning of one of the two substrates.

Example 6

Substrates made from silicon <001> with a diameter of 200 mm are prepared identically to the previous example.

The assembled substrates are next placed in a furnace in which a neutral nitrogen gas circulates at a temperature of 50° C., the neutral gas having a dew point of −80° C., for 43 days. At the end of this period, annealing at 300° C. is carried out directly in the storage furnace and, therefore, without transferring the wafers into a tube furnace. Similarly to the previous examples, the bonding at the end of this annealing does not show any bonding defect. Moreover, the degree of adhesion between the two substrates is sufficient to proceed with the mechanical thinning of one of the two substrates.

Naturally, the present disclosure is not limited to the above embodiments described and variants can be made thereto without departing from the scope of the invention as defined by the claims.

The present disclosure has a particular advantage with all assemblies of substrates leading to significant bonding defectiveness, such as the assembly of substrates having a very fine intermediate layer of insulator (less than 50 nm), the direct bonding of heterogeneous III-V materials for the purpose of forming junctions (such as junctions of a photovoltaic cell), or the bonding of substrates that have received intense surface activation steps (such as plasma activation or activation by mechanical chemical polishing).

The present disclosure also has an advantage in assembling substrates not normally leading to the appearance of bonding defects except in a zone located at the edges of wafers. This configuration may be linked to an accumulation of water at this point due to the propagation of the bonding wave, as is described in, for example, U.S. Patent Application Publication No. 2015/0079759 A1, which published Mar. 19, 2015, and is titled "Process for Bonding in an Atmosphere of a Gas having a Negative Joule-Thomson Coefficient," the contents of which are hereby incorporated herein in their entirety by this reference. The present disclosure and, in particular, the storage in an anhydrous environment, makes it possible in this case to eliminate this accumulation of water and to prevent the formation of defects that could form there accordingly.

Although examples using silicon wafers because of ease of procurement and experimentation have been given in the description of the present disclosure, the invention is in no way limited to this material. Moreover, one or other of the substrates may have a surface layer as an insulator. One or other of the substrates may comprise microelectronic components or simple metal connection pads. And, although step (b) of reinforcement of the degree of adhesion is easily implemented by means of annealing, as specified in this application, other treatments (in particular, thermal) may also be used for such reinforcement. It may be a case, for example, of microwave treatment or a laser treatment.

The assembly method of the present disclosure may be followed by a step of thinning one or both substrates 1, 2 by abrasion, grinding and/or chemical etching. It may also be a case of a step of detaching part of one of the two substrates 1, 2 along a fragile plane formed prior to assembly, for example, in accordance with the SMART CUT® technology.

What is claimed is:
1. A method of assembling two substrates by molecular adhesion, comprising:
a first step (a) of putting a first substrate and a second substrate in close contact in order to form an assembly having an assembly interface, at least one of the first substrate or the second substrate comprising a material formulated to chemically react with water;

before step (b), a step of anhydrously treating the first and second substrates in a treatment atmosphere having a dew point below −10° C.;

a second step (b) of reinforcing a degree of adhesion of the assembly beyond a threshold adhesion value at which water is no longer able to diffuse along the assembly interface; and maintaining the dew point of a working atmosphere to which the first and second substrates are exposed from a time of the anhydrous treatment step until the end of the second step (b) so as to limit or prevent the appearance of bonding defects at the assembly interface.

2. The method of claim 1, wherein maintaining the dew point of the working atmosphere comprises maintaining the dew point of the working atmosphere above −10° C. for less than 10 minutes from the step anhydrous treatment until the end of the second step (b).

3. The method of claim 1, wherein maintaining the dew point of the working atmosphere comprises maintaining the dew point of the working atmosphere below −10° C. from the anhydrous treatment step until the end of the second step (b).

4. The method of claim 1, wherein the second step (b) comprises thermal annealing of the assembly at a temperature or temperatures between 50° C. and 1200° C.

5. The method of claim 1, wherein the treatment atmosphere is static.

6. The method of claim 1, wherein the treatment atmosphere is at atmospheric pressure.

7. The method of claim 1, wherein the step (a) of putting the first substrate and the second substrate in close contact is carried out at ambient temperature.

8. The method of claim 1, further comprising rendering a surface of at least one of the first substrate and the second substrate hydrophilic.

9. The method of claim 1, further comprising a step of storing the assembly between the step of anhydrous treatment and the second step (b).

10. The method of claim 1, wherein the step of anhydrous treatment precedes or is performed simultaneously with the first step (a).

11. The method of claim 10, wherein the step of anhydrous treatment has a duration of at least 30 seconds and is performed before the first step (a) of putting the first substrate and the second substrate in close contact in order to form the assembly.

12. The method of claim 1, wherein the step of anhydrous treatment is performed after the first step (a) of putting the first substrate and the second substrate in close contact in order to form the assembly.

13. The method of claim 12, wherein the first step (a) of putting the first substrate and the second substrate in close contact in order to form the assembly is performed in an atmosphere having a dew point above −10° C.

14. The method of claim 12, wherein the step (c) of anhydrous treatment is performed at a temperature or temperatures between 20° C. and 150° C.

15. The method of claim 14, wherein at least one of the first substrate and the second substrate comprises silicon, and the step of anhydrous treatment is performed at a temperature or temperatures between 40° C. and 60° C.

16. A method of bonding together a first substrate and a second substrate by molecular adhesion, comprising:

before reinforcing a degree of adhesion between the first substrate and the second substrate, exposing the first substrate and the second substrate to an anhydrous treatment atmosphere having a dew point below −10° C., at least one of the first substrate or the second substrate comprising a material formulated to chemically react with water;

closely contacting the first substrate and the second substrate and forming an assembly having an assembly interface between the first substrate and the second substrate;

reinforcing a degree of adhesion between the first substrate and the second substrate of the assembly beyond a threshold adhesion value at which water is no longer able to diffuse along the assembly interface; and controlling a dew point of a working atmosphere to which the first substrate and the second substrate are exposed from the time the first substrate and the second substrate are exposed to the anhydrous treatment atmosphere until the end of the reinforcement of the degree of adhesion between the first substrate and the second substrate of the assembly beyond a threshold adhesion value, and limiting or preventing appearance of bonding defects at the assembly interface resulting from presence of water at the assembly interface.

17. The method of claim 16, wherein reinforcing the degree of adhesion between the first substrate and the second substrate comprises thermally annealing the assembly at a temperature or temperatures between 50° C. and 1200° C.

18. The method of claim 17, wherein the first substrate and the second substrate are exposed to the anhydrous treatment atmosphere before the closely contacting of the first substrate and the second substrate.

19. The method of claim 17, wherein the first substrate and the second substrate are exposed to the anhydrous treatment atmosphere after the closely contacting of the first substrate and the second substrate.

20. The method of claim 17, wherein the first substrate and the second substrate are exposed to the anhydrous treatment atmosphere simultaneously with the closely contacting of the first substrate and the second substrate.

* * * * *

UNITED STATES PATENT AND TRADEMARK OFFICE
CERTIFICATE OF CORRECTION

PATENT NO. : 9,718,261 B2
APPLICATION NO. : 14/947254
DATED : August 1, 2017
INVENTOR(S) : Didier Landru et al.

It is certified that error appears in the above-identified patent and that said Letters Patent is hereby corrected as shown below:

In the Claims

Claim 2, Column 13, Line 17, change "the step anhydrous" to --the step of anhydrous--

Signed and Sealed this
Eighth Day of May, 2018

Andrei Iancu
*Director of the United States Patent and Trademark Office*